US005235488A

United States Patent [19]

Koch

[11] Patent Number: 5,235,488

[45] Date of Patent: Aug. 10, 1993

[54] WIRE WOUND CORE

[75] Inventor: Stuart Koch, Philadelphia, Pa.

[73] Assignee: Brett Products, Inc., Philadelphia, Pa.

[21] Appl. No.: 831,427

[22] Filed: Feb. 5, 1992

[51] Int. Cl.[5] .......... H05K 1/41

[52] U.S. Cl. .......... 361/45; 336/177; 335/281

[58] Field of Search .......... 361/45; 336/175, 177, 336/234, 233; 335/281, 282

[56] References Cited

U.S. PATENT DOCUMENTS 4,641,216 2/1987 Morris et al. .......... 361/45
4,916,425 4/1990 Zabar .......... 336/177

*Primary Examiner*—Todd E. DeBoer
*Attorney, Agent, or Firm*—Simpson & Simpson

[57] ABSTRACT

Disclosed is a helically wound core of ferrous material used as a differential current sensor core in the ground fault sensor of a ground fault interrupter circuit. The ferrous material comprises a single strand of wire which is wound in helical fashion to create a tubular shaped core comprising a series of wire loops (all part of the single strand) parallel to each other and running the length of the tubular shape. The core is placed around a pair of current carrying lines to be monitored for ground faults (one line leading to and one line leading away from the power source) to interact with the magnetic fields of the lines. Toroidally wound leads wrapped around the wire core act as a secondary and are connected to a ground fault interruption circuit to shut off the power to the conducting lines in the event that the sensor detects a difference in current in the lines. By utilizing wire as the core material, the amount of surface area can be greatly increased over the prior art cores without increasing the cross-sectional area (and, therefore, the overall size) of the core.

4 Claims, 4 Drawing Sheets

FIG. 2A
PRIOR ART
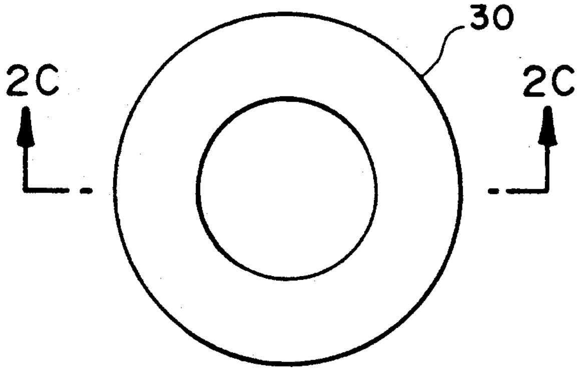
FIG. 2B
PRIOR ART
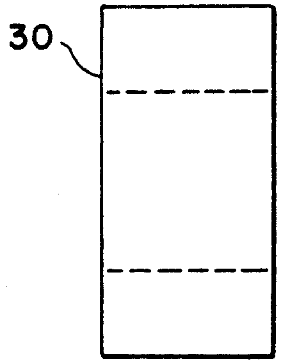
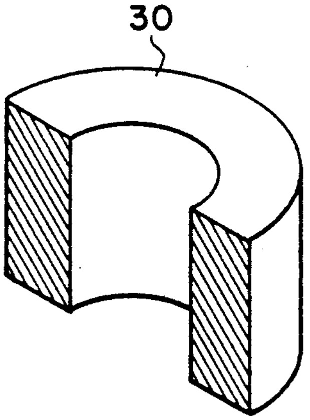
FIG. 2C
PRIOR ART
FIG. 3A
PRIOR ART
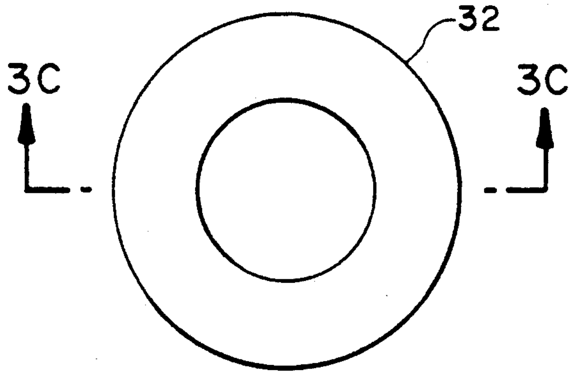
FIG. 3B
PRIOR ART
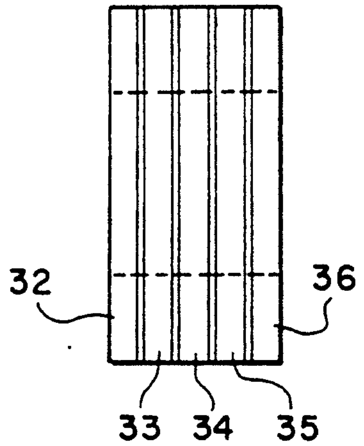
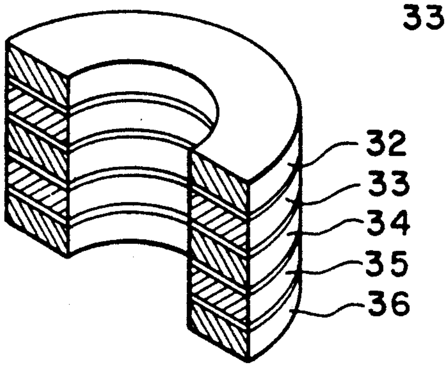
FIG. 3C
PRIOR ART

FIG. 6

| TEST TYPE/ CONDITION | WASHER TYPE | | WIRE WOUND | |
|---|---|---|---|---|
| | PERMEABILITY | % CHANGE FROM PREVIOUS MEASUREMENT | PERMEABILITY | % CHANGE FROM PREVIOUS MEASUREMENT |
| DEMAGNETIZED/ UNDAMAGED | 50, 474 | N/A | 33, 334 | N/A |
| DEMAGNETIZED/ ONE ELEMENT COMPLETELY REMOVED | N/A | N/A | 33, 082 | -1% |
| DEMAGNETIZED/ ONE KINK | 39, 768 | -21% | 31, 416 | -5% |
| DEMAGNETIZED/ TWO KINKS | 30, 519 | -23% | 30, 970 | -1.4% |
| AFTER DC SHOCK/ UNDAMAGED | 41, 010 | N/A | 25, 839 | N/A |
| AFTER DC SHOCK/ ONE ELEMENT COMPLETELY REMOVED | N/A | N/A | 25, 388 | -2% |
| AFTER DC SHOCK/ ONE KINK | 32, 403 | -21% | 24, 260 | -4% |
| AFTER DC SHOCK/ TWO KINKS | 24, 761 | -24% | 23, 933 | -1% |

WIRE WOUND CORE

FIELD OF THE INVENTION

This invention relates to the field of cores used in devices utilizing the priciple of induction, and in particular, to a helical core made of a single strand of wire that comprises a ground fault sensor core.

PRIOR ART

Ground fault sensors are used to detect imbalances in the electric current in a power line being monitored by the sensor. FIG. 1 illustrates a typical ground fault detection circuit. As shown in FIG. 1, a power line comprises two current carrying lines 10 and 12, usually wires, one leading from the source of power to the load 16 and the other leading back to the power source from the load 16. A core 14 of high magnetic permeability is inductively coupled to the pair of lines 10 and 12 by, for example, having the wires pass through core 14. By passing through core 14, lines 10 and 12 form a primary winding. Toroidally wound leads 20 wrapped around the core 14 interact with the magnetic field within the core 14. Specifically, the current carrying lines 10 and 12 act as a primary and induce current into the toroidally wound leads 20, which act as a secondary. The primary formed by current carrying line 10 and 12 combined with the core 14 and the secondary formed by the toroidally wound leads comprises the ground fault sensor of the ground fault detection circuit of FIG. 1. In normal operation, each current carrying wire 10 and 12 carries equal amounts of current but in opposite directions. Magnetic fields resulting from the current in the two wires 10 and 12 cancel each other and the net voltage on the toroidally wound leads 20 is zero.

In FIG. 1, the toroidally wound leads 20 (the secondary) of the sensor are connected to an amplifying means 22, which is connected to processing means 24 that operates to shut off power in the line upon receiving an electrical signal from the amplifying means 22. When the power lines are operating normally (i.e., when there is no ground fault) no signal will be generated since the magnetic fields in the conducting lines 10 and 12 will cancel each other out as they are of equal magnitude and in opposite direction.

When a ground fault occurs, an imbalance in current exists as the current through the wires 10 and 12 is divided into two return paths, one through the neutral and the other through the ground (the fault). The current differential produces a magnetic field that in turn induces a voltage on the toroidally wound leads 20. This signal is amplified by amplifier 22 and sent to the processing means 24 which cuts off power to the line and prevents further damage.

The core material used in the core 14 of the ground fault sensor should exhibit high magnetic permeability. FIGS. 2(*a–c*) through 4(*a–c*) illustrate three typical prior art core configurations chosen because they supply adequate levels of magnetic permeability. In FIGS. 2(*a*) through 2(*c*), a solid core 30, typically comprising a ring of sintered ferrous material, is shown. FIGS. 3(*a*) through 3(*c*) illustrate ring shaped washers 32–36 stacked upon one another to form the core. FIGS. 4(*a*) through 4(*c*) illustrate a tape wound core. A tape wound core typically comprises ribbons of ferrous material 38 wound in several layers to create a circular magnetic path of high magnetic permeability. One example of such a tape wound core is shown in U.S. Pat. No. 4,366,520 to Finke et al.

Each of the three prior art cores referred to above have certain inherent drawbacks. Specifically, a continuous, solid core as shown in FIG. 2 contains many small air gaps which reduce the magnetic permeability of the core. Additionally, each of the prior art cores, to varying degrees, can be severely damaged by mechanical shock. For example, if the solid core of FIG. 2 is broken due to a mechanical shock, the continuous path (the solid core) will be broken and the device will not operate properly. If the washer type core is subjected to a mechanical shock, large portions of the core will not function properly if one or more of the washers is deformed. A similar result occurs when a tape type core is subjected to mechanical shock. Further, prior art cores do not allow for free expansion and contraction of the material which occurs with temperature changes. The annealing process required in the manufacture of such cores subjects them to high temperatures and introduces stress in the core upon cooling and contraction that decreases permeability. Similar stresses may be induced in the core upon normal operation. While the temperature extremes are not as great as during the annealing process, they do have a degrading effect.

It is known that materials are much more permeable at or near their surface. Therefore, it is desirable to increase the surface area of the core material to increase the permeability. The tape type core represents one method of increasing the surface area of the core material, but it still suffers from the above-mentioned problems.

SUMMARY OF THE INVENTION

The present invention comprises a helical wound core of ferrous material use as a differential current sensor core in a ground fault interrupter circuit. The ferrous material comprises a single strand of wire which is wound in helical fashion to create a tubular shaped core comprising a series of wire loops (all part of the single strand) parallel to each other and running the length of the tubular shape. The core is placed around a pair of current carrying lines to be monitored for ground faults (one line leading to and one line leading away from the power source) to interact with the magnetic fields of the lines. Toroidally wound leads wrapped around the wire core act as a secondary and are connected to a ground fault interruption circuit to shut off the power to the conducting lines in the event that the sensor detects a difference in current in the lines. By utilizing wire as the core material, the amount of surface area can be greatly increased over the prior art cores without increasing the cross-sectional area (and, therefore, the overall size) of the core.

An object of the present invention is to provide a sensor for ground fault detection circuits that maximizes magnetic permeability to current differential and thus has a greater sensitivity.

Another object of the invention is to provide a ground fault sensor that is less likely to lose permeability due to extremes in temperature because of its ability to expand axially.

Another object of the invention is to provide a ground fault sensor that is less likely to lose permeability due to structural damage to individual components.

Still another object of the invention is to provide a ground fault detector that is relatively inexpensive to make.

Other objectives of the invention will become apparent to those skilled in the art once the invention is shown and described.

DESCRIPTION OF THE DRAWINGS

FIGS. 2(*a*), 2(*c*) are a top and cross-sectional perspective view, respectively, of a prior art solid ferrous sensing core;

FIGS. 2(*b*) is a side view of FIG. 2(*a*);

FIGS. 3(*a*), 3(*c*) are a top and cross-sectional perspective view, respectively, of a prior art washer type sensing core;

FIG. 3(*b*) is a side view of FIG. 3(*a*);

FIG. 4(*b*) is a side view of FIG. 4(*a*);

FIG. 5(*b*) is a side view of FIG. 5(*a*);

FIG. 6 is a table showing the results of damage tests performed on a washer type sensing core and a core in accordance with the present invention.

DESCRIPTION OF THE PREFERRED EMBODIMENT

Figure 5A:
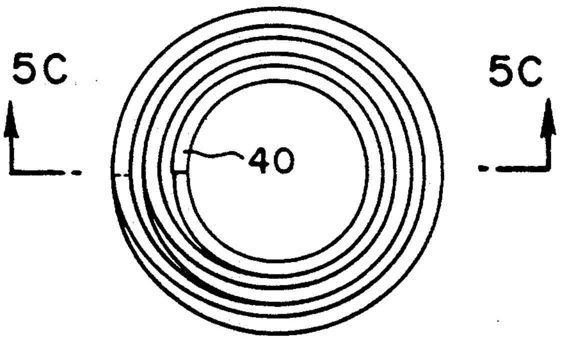
FIGS. 5(*a*), 5(*c*) are a top and cross-sectional perspective view, respectively, of a helical sensing core of the present invention.
Figure 5B:
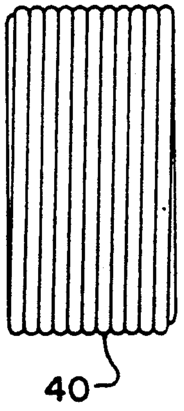
Figure 5C:
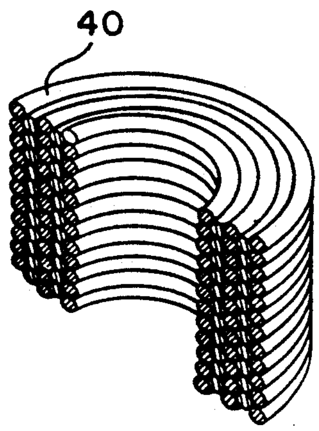

The ground fault detector core of the present invention is shown in FIGS. 5(*a*) through 5(*c*). As shown in FIGS. 5(*a*) through 5(*c*), the core of the present invention comprises a single strand of wire 40 disposed in a series of turns or loops. The loops run parallel to one another and thus form an essentially tubular shaped core. The conducting wires for which ground faults are being detected pass through the tubular shaped core. In a preferred embodiment, the loops and, therefore, the core, is circular in shape, although the core may be oval shaped instead. A more circular construction provides for uniformity in manufacture.

A wire wound core is more permeable to magnetic fields and less susceptible to reductions in permeability due to temperature extremes. The permeability of a material to magnetic fields is directly proportional to the surface area-to-volume ratio of the material. A wire wound core having the same cross sectional area as a washer type core has more than twice the surface area than that of a washer type core. For example, a washer type core using four stacked washers, each having a thickness of 0.0134 inch, a 0.480 inch outside diameter (O.D.) and a 0.348 inch inside diameter (I.D.), has a total surface area 0.836 inches squared, calculated as follows:

$$A_s = 8\pi[(R^2 - r^2) + (0.0134)(R + r)] = 0.836 \text{ inches}^2$$

where $R = \frac{1}{2}$ O.D. and $r = \frac{1}{2}$ I.D.

To manufacture a core having the same cross-sectional area in accordance with the present invention, seventy (70) turns of 0.008 inch diameter wire would be needed. The total surface area for such a wire wound core is 2.23 inches squared, calculated as follows:

$$A_s = 2\pi R(l \times 70 + R) = 2.23 \text{ inches}^2$$

where $R$ = radius of the wire and $l$ = length per turn.

As can be seen, the wire wound core having the same cross-sectional area as the washer type core has almost three times the highly permeable surface area as the washer type core.

Results of destructive testing performed on a washer type core and a wire wound core indicate that the permeability of the wire wound core is reduced considerably less than a washer type core when each are subjected to similar destructive events. The testing was performed to simulate the effect of physical damage to a portion of a core such as that which would occur by dropping or crushing the core. In the tests, a washer type core having the same specifications as the washer type core described above, had one of its rings "kinked" (i.e., bent). This has the effect of destroying the magnetic properties of the kinked ring. The demagnetized permeability and the permeability of the core after being subjected to a DC shock (to set the core material in the remanent state) was then measured and recorded. The same process was then carried out on a second washer of the same core, and the same measurements were taken and recorded.

Next, a wire wound core comprising 62 turns of 0.008 inch diameter wire, and having a path length of 2.16 inches, was subjected to having a single turn of wire (or one element) completely removed. This had to be done in order to gain access to the remaining turns of wire to be able to kink them. The magnetized permeability and the permeability after a DC shock were measured and recorded, and then a turn of wire was kinked, and the same measurements were taken and recorded. Finally, a second turn of wire was kinked and the same tests were run again. The results of the tests, shown in the table of FIG. 6, clearly indicated that the permeability of the washer type core is reduced by a much larger amount than that of the wire wound core of the present invention when a similar number of elements (washers or turns of wire) are similarly damaged.

Figure 1:
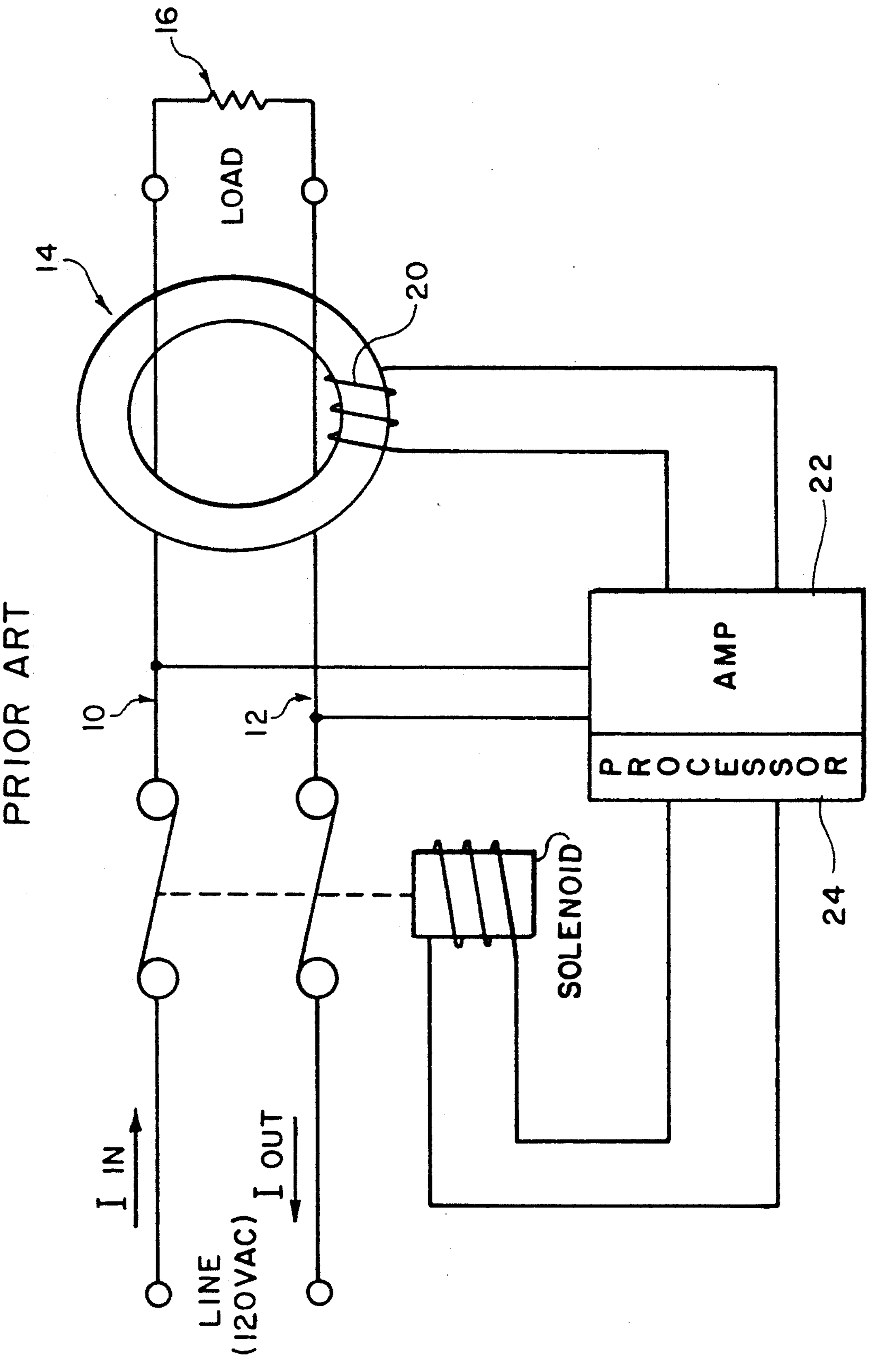
FIG. 1 PRIOR ART
FIG. 1 is a block diagram of a typical ground fault detection circuit.
Figure 4A:
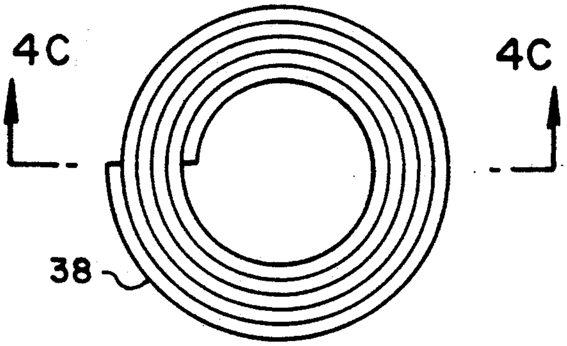
FIG. 4A PRIOR ART
FIGS. 4(*a*), 4(*c*) are a top and cross-sectional perspective view, respectively, of a prior art tape wound sensing core.
Figure 4B:
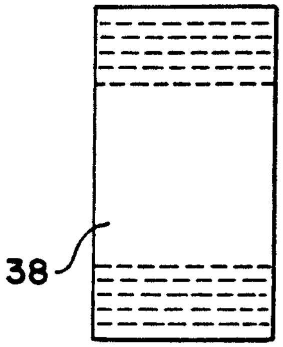
FIG. 4B PRIOR ART
Figure 4C:
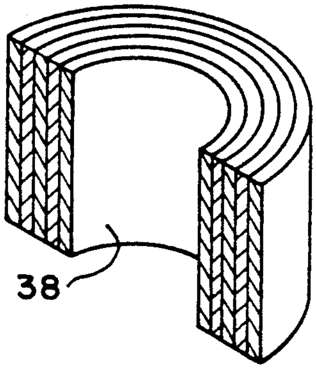
FIG. 4C PRIOR ART

The sensing core of the present invention can be utilized in known ground fault detection/interruption circuits, for example, in the circuit of FIG. 1. It is preferred that the wire used be of a ferrous nickel alloy, for example, that sold under the trade name of "Carpenter HyMu 80" alloy by the Carpenter Technology Corporation of Reading, Pa. This material is an unoriented 80% nickel-iron-molybdenum alloy. One preferred embodiment of the core would consist of a 40 turn core of 0.012" wire, comprising 4 layers, each of 10 turns, and having an inside diameter of 0.350". The preferred method of construction is by winding the wire on a mandrel and then encasing the wire wound core in plastic to protect it and insulate it from the toroidally wound leads. As recommended by the manufacturer and in accordance with industry standards, the annealing of the wire should be performed, prior to encasing the wound core in plastic, at 2050–2150 degrees F.

The many features and advantages of the invention are apparent from the detailed specification and thus it is intended by the appended claims to cover all such features and advantages of the invention which fall within the true spirit and scope thereof. For example, the core disclosed above, while described with reference to a ground fault sensor, can also be used as a core for a transformer, inductor, solenoid, electromagnet, motor/generator, magnetic recording head, magnetic bearing or any other device that utilizes a core in conjunction with the principle of inductive coupling. Further, since numerous modifications and changes will readily be apparent to those skilled in the art, it is not desired to limit the invention to the exact construction and operation illustrated and described, and accordingly all suitable modifications and equivalents may be resorted to, falling within the scope of the invention.

I claim:

1. A differential current sensing electrical circuit system for detecting ground faults in electric power lines, comprising:

a continuous strand of ferrous material arranged in circular windings of helical fashion so as to form a cylindrical-shaped core composed of said windings in parallel relation to one another and relatively close to one another;

amplifying means in connection with said core for amplifying electrical signals in said core; and power cut off means for cutting power to said power line in the event an electrical signal is detected in said core, said core being disposed around a portion of said power line so as to interact with the magnetic field of said power line.

2. A wire wound toroidal core adapted for placement around power lines so as to interact with the magnetic field of said power lines upon the occurrence of ground faults in said power lines, said core comprising a single strand of wire helically wound to form a plurality of loops, said loops being situated essentially parallel to one another.

3. A wire wound toroidal core as set forth in claim 2, wherein said strand of wire is wound to form a plurality of layers of said loops, each of said layers comprising a predetermined number of said loops.

4. A wire wound toroidal core comprising a single strand of wire helically wound to form a plurality of loops, said loops being situated essentially parallel to one another, said core enabling inductive interaction between a primary and a secondary placed in the inductive field of said core.

* * * * *